US012589987B2

(12) United States Patent
Jennings et al.

(10) Patent No.: US 12,589,987 B2
(45) Date of Patent: Mar. 31, 2026

(54) MICROELECTROMECHANICAL SYSTEMS SENSOR WITH FREQUENCY DEPENDENT INPUT ATTENUATOR

(71) Applicant: Knowles Electronics, LLC, Itasca, IL (US)

(72) Inventors: Michael Jennings, McKinney, TX (US); Steven Boor, Plano, TX (US); Divya Kesharwani, Rolling Meadows, IL (US)

(73) Assignee: Knowles Electronics, LLC, Itasca, IL (US)

( * ) Notice: Subject to any disclaimer, the term of this patent is extended or adjusted under 35 U.S.C. 154(b) by 762 days.

(21) Appl. No.: 18/090,987

(22) Filed: Dec. 29, 2022

(65) Prior Publication Data

US 2024/0217810 A1     Jul. 4, 2024

(51) Int. Cl.
*B81B 7/00* (2006.01)
*B81C 1/00* (2006.01)

(52) U.S. Cl.
CPC ............ *B81B 7/008* (2013.01); *B81C 1/0023* (2013.01); *B81B 2201/0221* (2013.01); *B81B 2207/03* (2013.01); *H04R 2201/003* (2013.01)

(58) Field of Classification Search
CPC ............ B81B 7/008; B81B 2201/0221; B81B 2207/03; B81B 3/0013; B81B 7/0064;
(Continued)

(56) References Cited

U.S. PATENT DOCUMENTS

| | | |
|---|---|---|
| 9,743,167 B2 | 8/2017 | Nielsen et al. |
| 11,095,990 B2 | 8/2021 | Hansen et al. |

(Continued)

OTHER PUBLICATIONS

Niederberger, Mark, U.S. Appl. No. 18/087,327, "Microelectromechanical Systems Sensor with Stabilization Circuit", filed Dec. 22, 2022.
(Continued)

*Primary Examiner* — Carolyn R Edwards
*Assistant Examiner* — Julie X Dang
(74) *Attorney, Agent, or Firm* — Hickman Becker Bingham Ledesma LLP; Matthew Loppnow

(57) ABSTRACT

A microelectromechanical systems (MEMS) sensor, a capacitive MEMS motor sensing circuit and a method are provided. The present application provides a microelectromechanical systems (MEMS) sensor. The MEMS sensor includes a housing having electrical contacts disposed on an exterior of the housing. The MEMS sensor further includes a capacitive MEMS motor disposed in the housing, and an electrical circuit disposed in the housing and being electrically coupled to the electrical contacts. The electrical circuit includes a bias voltage source having an output coupled to an input of the MEMS motor. The electrical circuit further includes a buffer circuit including an amplifier input stage having an input coupled to an output of the MEMS motor. The electrical circuit still further includes a frequency dependent input attenuator including a feedback capacitor and an input attenuator low pass filter, the input attenuator low pass filter having an input coupled to the output of the amplifier input stage and an output coupled to a first terminal of the feedback capacitor, where a second terminal of the feedback capacitor is coupled to the input of the amplifier input stage.

16 Claims, 6 Drawing Sheets

(58) Field of Classification Search
CPC .......... B81B 3/0056; B81B 2201/0257; B81B
2203/04; B81B 2203/0127; B81C 1/0023;
H04R 2201/003; H04R 19/04; H04R
3/00; H04R 19/005; H04R 3/06; H04R
3/04; H04R 1/04; H04R 3/02; H04R
7/04; H04R 19/00; H03F 3/183; H03F
2200/03; H03F 3/45071; H03F 1/0211;
H03F 2200/511; H02M 3/07; H02M
1/0045
See application file for complete search history.

(56) References Cited

U.S. PATENT DOCUMENTS

| | | | |
|---|---|---|---|
| 2010/0310096 A1* | 12/2010 | Josefsson | H04R 3/06 |
| | | | 381/113 |
| 2012/0087515 A1* | 4/2012 | Poulsen | H03F 3/187 |
| | | | 330/192 |
| 2013/0271307 A1* | 10/2013 | Kropfitsch | H03G 3/002 |
| | | | 341/158 |
| 2017/0318385 A1* | 11/2017 | Harney | H04R 3/00 |
| 2021/0396795 A1 | 12/2021 | Jennings et al. | |

OTHER PUBLICATIONS

Toft, Jakob et al., U.S. Appl. No. 17/960,692, "Microphone Assembly with Disturbance Compensation", filed Oct. 5, 2022.

\* cited by examiner

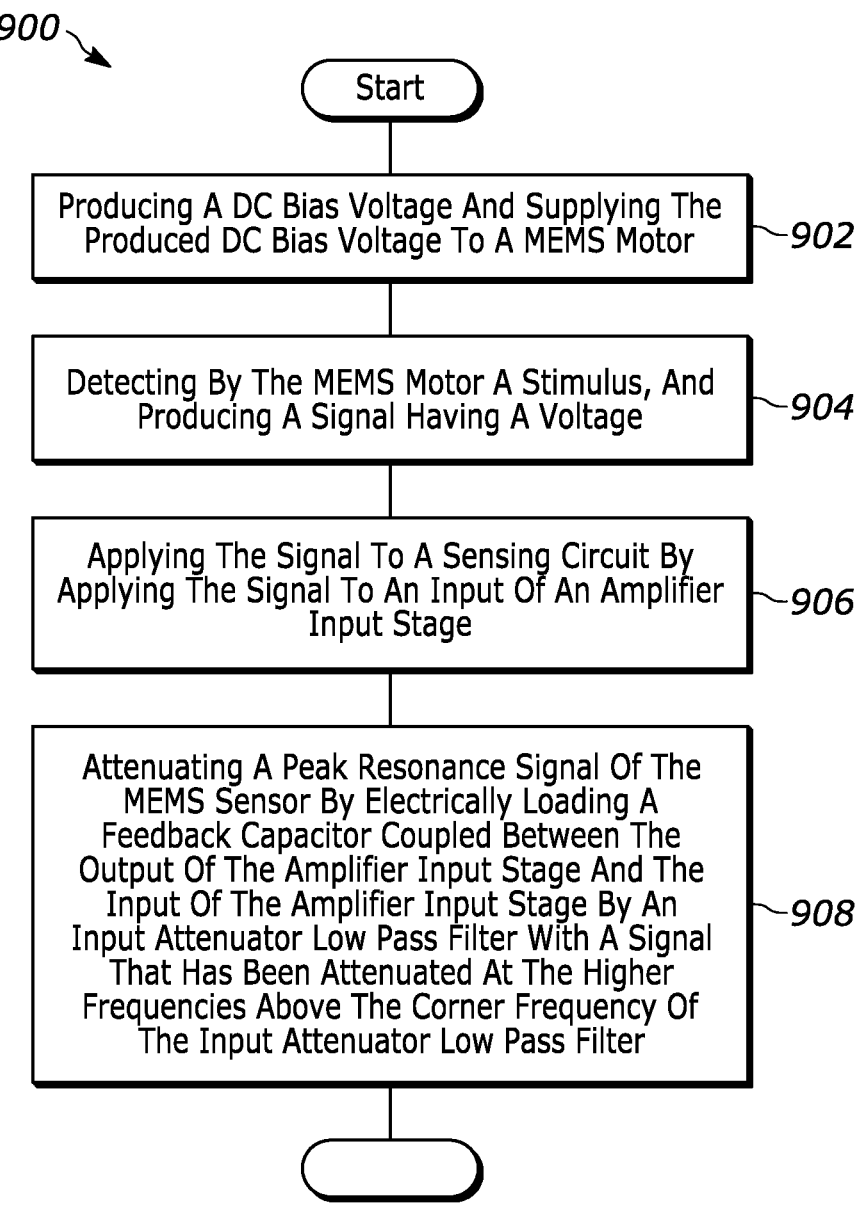

*900*

Start

Producing A DC Bias Voltage And Supplying The Produced DC Bias Voltage To A MEMS Motor ~902

Detecting By The MEMS Motor A Stimulus, And Producing A Signal Having A Voltage ~904

Applying The Signal To A Sensing Circuit By Applying The Signal To An Input Of An Amplifier Input Stage ~906

Attenuating A Peak Resonance Signal Of The MEMS Sensor By Electrically Loading A Feedback Capacitor Coupled Between The Output Of The Amplifier Input Stage And The Input Of The Amplifier Input Stage By An Input Attenuator Low Pass Filter With A Signal That Has Been Attenuated At The Higher Frequencies Above The Corner Frequency Of The Input Attenuator Low Pass Filter ~908

FIG. 9

MICROELECTROMECHANICAL SYSTEMS SENSOR WITH FREQUENCY DEPENDENT INPUT ATTENUATOR

FIELD OF THE DISCLOSURE

The present disclosure is directed to a microelectromechanical systems (MEMS) sensor with a frequency dependent input attenuator, and more particularly an attenuation circuit, which at least partially addresses detectable noise including noise substantially present outside of the audible frequency band prior to intermodulation products of said noise form, and are able to manifest in the audible frequency band.

BACKGROUND

Microphones and other known sensors generally comprise a transduction element that generates an electrical signal representing a sensed environmental condition, like sound, and a signal conditioning circuit and/or interface circuit, like an application specific integrated circuit (ASIC). These components are typically integrated in a package referred to as a sensor assembly. In many instances the interface circuit will incorporate an amplifier or buffer, which is used for conditioning the signal produced by a capacitive MEMS motor in response to a sensed condition. Capacitive MEMS motors, such as those for use as a microphone, can have multiple mechanical and acoustic resonances, which can have an effect on the frequency response associated with the motor, and which can sometimes manifest as noise or distortion.

Due to high peak sensitivity at microphone acoustic peak, distortion in the signal path can occur as a result of high signal amplitudes from supply clipping, biasing diodes, and/or slew rate limitations. Even if the source of the noise in the signal is outside the audio band, intermodulation distortion can still occur inside the audio band if the tones associated with the noise and/or distortion are audio frequencies apart. With inaudible input tones, the demodulated tones are highly undesirable noise artifacts to the customer.

The present inventors have recognized that attenuation at the input of the analog signal path can be desirable to help reduce the amplitude in the signal path, because once the amplitude is high enough to cause distortion within the signal path circuitry, it can become more difficult to filter the demodulated tones. The present inventors have further recognized that while wideband attenuation of the input signal can more generally broadly reduce the input signal, it is not always desirable or feasible for many customer use cases, as it can negatively affect the strength of the portion of the signal that the customer wants to maintain, as well as can decrease the system level signal to noise ratio. Correspondingly, the present inventors have further recognized that an input attenuation that is unity gain within the desired audio bandwidth, but which begins to increasingly reduce the input signal at a specified frequency may be desired. Further yet, tuning of the specified frequency and the attenuation amplitude may be possible for better balancing the tradeoffs between noise and intermodulation distortion suppression of the more undesirable portions of the sensed input signal, and any resulting corresponding sensitivity droop.

SUMMARY

The present application provides a microelectromechanical systems (MEMS) sensor. The MEMS sensor includes a housing having electrical contacts disposed on an exterior of the housing. The MEMS sensor further includes a capacitive MEMS motor disposed in the housing, and an electrical circuit disposed in the housing and being electrically coupled to the electrical contacts. The electrical circuit includes a bias voltage source having an output coupled to an input of the MEMS motor. The electrical circuit further includes a buffer circuit including an amplifier input stage having an input coupled to an output of the MEMS motor. The electrical circuit still further includes a frequency dependent input attenuator including a feedback capacitor and an input attenuator low pass filter, the input attenuator low pass filter having an input coupled to the output of the amplifier input stage and an output coupled to a first terminal of the feedback capacitor, where a second terminal of the feedback capacitor is coupled to the input of the amplifier input stage.

According to another possible embodiment, a capacitive microelectromechanical systems (MEMS) motor sensing circuit is provided, which comprises a buffer circuit including an amplifier input stage having an input connectable to an output of the MEMS motor. The electrical circuit still further includes a frequency dependent input attenuator including a feedback capacitor and an input attenuator low pass filter, the input attenuator low pass filter having an input coupled to the output of the amplifier input stage and an output coupled to a first terminal of the feedback capacitor, where a second terminal of the feedback capacitor is coupled to the input of the amplifier input stage.

According to another possible embodiment, a method is provided. The method includes producing a DC bias voltage and supplying the produced DC bias voltage to a MEMS motor. A stimulus is detected by the MEMS motor, and a signal having a voltage is produced. The signal is applied to a sensing circuit by applying the signal to an input of an amplifier input stage. A peak resonance signal of the MEMS sensor is attenuated by electrically loading a feedback capacitor coupled between the output of the amplifier input stage and the input of the amplifier input stage by an input attenuator low pass filter with a signal that has been attenuated at the higher frequencies above the corner frequency of the input attenuator low pass filter.

These and other objects, features, and advantages of the present application are evident from the following description of one or more preferred embodiments, with reference to the accompanying drawings.

BRIEF DESCRIPTION OF THE DRAWINGS

FIG. 9 is a flow diagram of a method of operating a sensor assembly with a frequency dependent input attenuator.

DETAILED DESCRIPTION

Figure 1:
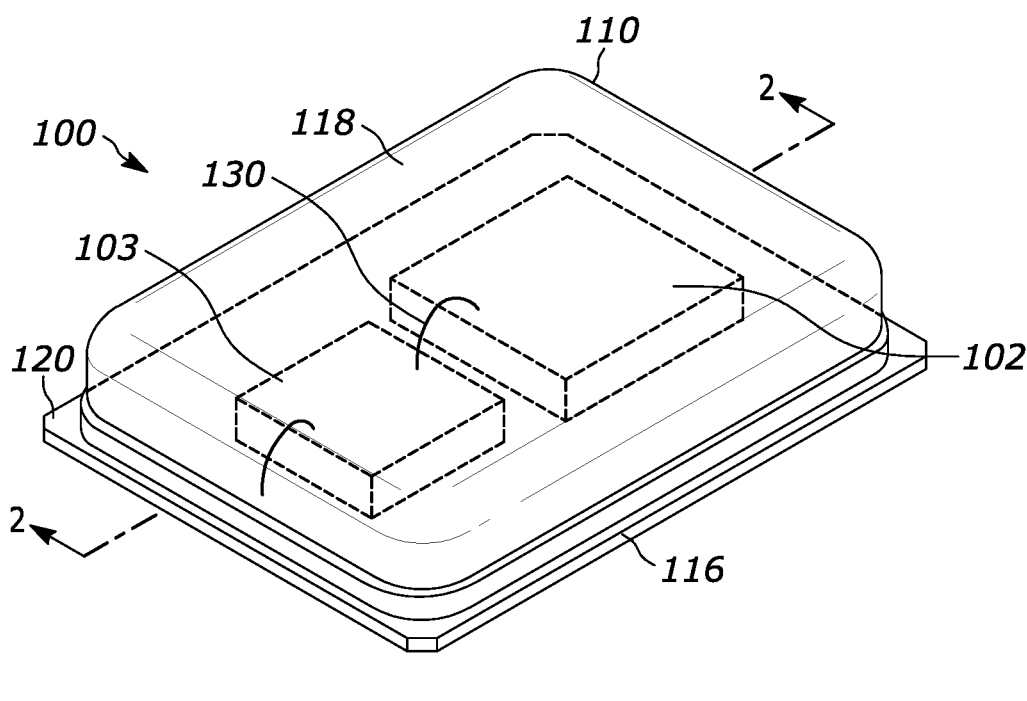
FIG. 1 is an isometric view of an exemplary microelectromechanical systems (MEMS) sensor.

While the present disclosure is susceptible of embodiment in various forms, there is shown in the drawings and will hereinafter be described presently preferred embodiments with the understanding that the present disclosure is to be considered an exemplification of the invention and is not intended to limit the invention to the specific embodiments illustrated. One skilled in the art will appreciate that the elements in the drawings are illustrated for simplicity and clarity and therefore may have not necessarily been drawn to scale, and may not include some well-known features. For example, the dimensions of some of the elements in the drawings may be exaggerated relative to other elements with the intent to help improve understanding of the aspects of the embodiments being illustrated and described.

The present disclosure relates to sensor assemblies, electrical circuits for use in a sensor assembly, and methods thereof, which make use of a buffer circuit and a frequency dependent input attenuator as part of a feedback path associated with the buffer circuit for providing attenuation of the output of a capacitive sensor including the sensed signal at the input of the analog signal path. The sensor assembly generally comprises one or more transduction elements that produce an output signal that is proportional to a sensed environmental condition. The sensor can be a capacitive, piezo or optical electro-acoustic transduction element among other known and future sensors configured to convert the sensed environmental condition into a corresponding electrical signal. Such sensors can be fabricated from microelectromechanical systems (MEMS) or some other known or future technology. In one implementation, the sensor is an acoustic sensor and the electrical circuit is a microphone signal processing circuit. In other implementations, the sensor is a non-acoustic sensor and the electrical circuit is a non-acoustic sensor signal processing circuit. Such other sensors include pressure, temperature, gas, vibration, and humidity sensors, among others.

Figure 2:
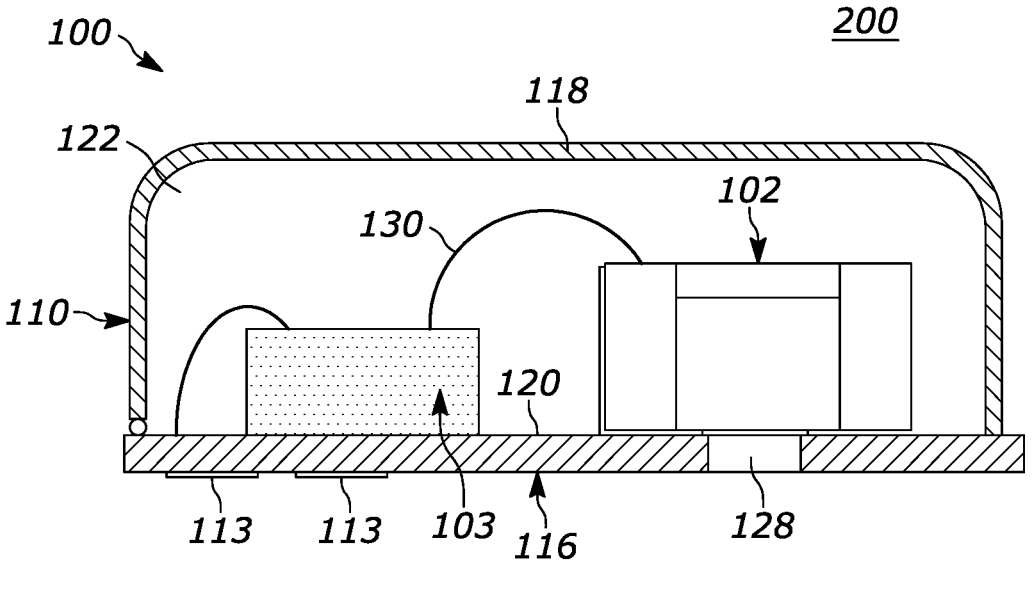
FIG. 2 is a cross sectional view of the exemplary MEMS sensor, illustrated in FIG. 1.

In accordance with at least one embodiment, a sensor assembly generally comprises a transducer, such as a microelectromechanical systems (MEMS) motor, and an electrical circuit disposed in a housing configured to interface with a host device. FIGS. 1 and 2, illustrate such an exemplary microelectromechanical systems (MEMS) sensor. More specifically, FIG. 1 illustrates an isometric view of an exemplary sensor assembly 100, and FIG. 2 illustrates a cross sectional view 200 of the exemplary sensor assembly 100. The sensor assembly 100 includes a transducer 102 coupled to an electrical circuit 103 disposed within a housing 110. The housing includes a base 116, and a cover 118 fastened to an upper surface 120 of the base. In some implementations, the housing shields the transducer and the electrical circuit located within the interior 122 of the housing from electromagnetic interference like RF noise. For this purpose, the cover can be metal or include a conductive portion electrically coupled to a conductive portion of the base. The housing can also include an electrical interface with contacts (e.g., supply, ground, data, clock, select, etc.) configured to interface with a host device. In FIG. 2, the host-interface is a surface-mount interface 113 located on an outer surface of the base 116 and is suitable for reflow soldering processes. In other embodiments, the host-interface can have some other form factors, like through-hole pins and/or plated through holes to receive through-hole pins, and the interface can be located on another part of the housing.

In some sensor assemblies, like microphones, the housing includes an aperture (also called a "port"), which can connect an interior of the housing to the external environment. In FIG. 2, the port 128 is located on the base 116 in alignment with the transducer 102. In other sensors, the port can be on some other part of the housing, like the cover or the sidewall. A port is not required in other sensor assemblies, like acoustic vibration sensors and accelerometers, among others.

In one embodiment, the sensor assembly is a microphone configured to generate an electrical signal representative of acoustic signals propagated through the atmosphere and detected by a transducer located within the housing. In other embodiments, the sensor assembly is configured to generate an electrical signal representative of vibrations. For example, the sensor assembly can be configured to detect acoustic vibrations propagated through a person's body or an inanimate object. Other sensor assemblies can be configured to detect pressure, acceleration, humidity, or temperature, among other conditions.

The electrical circuit generally comprises a processing circuit configured to process the electrical signal produced by the transducer and to provide the processed signal at the host interface of the sensor assembly. In FIGS. 1 and 2, the electrical circuit 103 is coupled to the transducer 102 via a connection 130, which can include one or more leads, such as a conductive wire. The electrical circuit is also coupled to contacts on the host-interface 113 via traces in the base for this purpose. The electrical circuit can obtain power, clock and other signals from contacts on the host-interface. In other implementations, the sensor assembly can include the transduction element and sensor signal processing circuit, but these elements are not necessarily disposed in or integrated within a housing.

Figure 3:
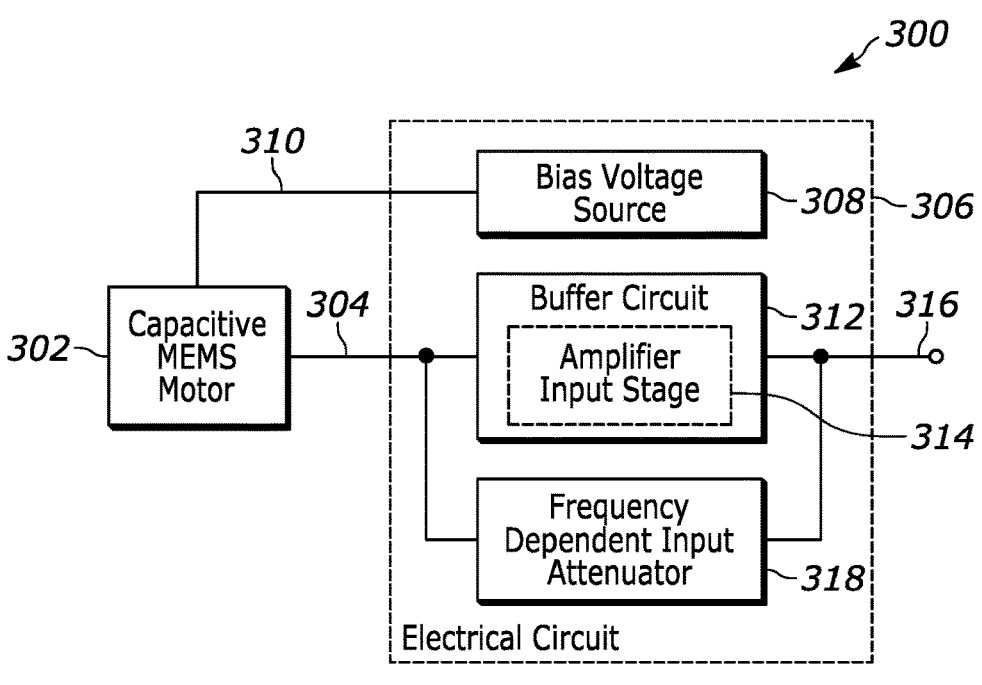
FIG. 3 is a block diagram of a MEMS sensor assembly, in accordance with at least one embodiment of the present application.

FIG. 3 illustrates a block diagram of a sensor assembly 300, in accordance with at least one embodiment of the present application. In the illustrated embodiment, the sensor assembly 300 includes a sensor, such as a capacitive MEMS motor 302, which can have one or more transduction elements organized and arranged for producing one or more electrical signals 304, and which are each associated with a respective one or more output terminals. The sensor assembly further includes an electrical circuit 306 including a bias voltage source 308 that has one or more bias output voltage terminals 310, where a respective one of one or more DC bias voltages is produced at each of the bias output voltage terminals, which are coupled to a transducer requiring a bias, for example, the capacitive MEMS motor 302. The electrical circuit 306 further includes a buffer circuit 312 having one or more input terminals associated with an amplifier input stage 314, each being coupled to a respective output terminal of the sensor. The buffer circuit 312 produces at an output including one or more output terminals 316, an output signal. In at least some configurations, the amplifier input stage 314 will be associated with a class AB amplifier.

The electrical circuit 306 further includes a frequency dependent input attenuator 318 coupled to the buffer circuit 312, and more particularly the amplifier input stage 314, for inducing a frequency dependent input attenuation in the electrical signals 304 being produced by the capacitive MEMS motor and being received at the input of the buffer circuit 312.

In at least some instances, a capacitive MEMS motor can have one or more resonances at one or more frequencies locations. The number and frequency location of the one or more resonances can sometimes be implementation dependent, with some of them being dependent upon the various geometries of the components that are used to form the sensor assembly, such as the microphone package. Mechanical resonances can manifest into the electronic signaling being produced due to the nature of the device, whereby the intended mechanical movement of one of the capacitive sensor elements in a MEMS type sensor motor, namely the diaphragm relative to a backplate capacitive sensor element in response to an acoustic pressure wave, is used to produce the variance in the electrical signaling produced by the sensor. Depending on the quality factor of the MEMS motor this can result in a sensor having mechanical and/or acoustic resonances at one or more frequencies that can manifest in the electronic signaling that does not readily dampen out. The quality factor of some resonators can reach relatively high values in the range of 10 to 1000. These resonances can impact the frequency response of a particular device and potentially contribute to noise and/or distortion. Even in instances in which the resonance is at a frequency that is traditionally outside the audio frequency range, the noise/distortion can mix with other sources of noise and/or distortion to produce an intermodulation product that is present in the audio frequency range.

For example, a second order intermodulation product can include energy that is present at a frequency that is a combination of the two frequencies (e.g. f1 and f2, where f2 is the larger of the two frequencies) of the signals, that contributed to the creation of the product. Second order intermodulation products can include signals at frequencies that are equal to (2*f1), (2*f2), (f2−f1), and/or (f1+f2). So, even if both f1 and f2 are outside of the audible frequency range, the two signals could contribute to an intermodulation product that is inside of the audible frequency range, and could be perceived by the user as noise or distortion. Still further, higher order intermodulation products are possible, which could contribute to noise and/or distortion being present at still further additional different frequencies.

The present inventors have recognized that it may be possible to attenuate these signals present outside of the audible frequency range while minimizing their impact on signals present in the audible frequency range, before they can combine to form intermodulation products, which might be present in the audible frequency range. By attenuating these signals before they form intermodulation products, when the intermodulation products are formed, they will have a reduced amplitude, which corresponds to the amount of attenuation. Furthermore, by addressing these sources of noise/distortion, while they are outside of the audible frequency range, they can be attenuated in a manner that is less likely to negatively affect the amplitude of more desirable signals that presumably would be present in the audible frequency range. For example, a low pass filter could be applied to target attenuation frequencies that are above a particular frequency, by tuning the low pass filter, so as to have its corner frequency at a particular predefined frequency, that is at or above the upper end of the desired audible frequency range. In turn this can attenuate potential sources of noise or distortion, that might originate outside of the audible frequency range, but could contribute to an intermodulation product at a frequency (e.g. (f2−f1)), that could manifest within the audible frequency range.

In addition to acoustic resonances, which may be present in the physical geometries of the capacitive sensor, still further sources of potential noise/distortion could be a function of non-linearities associated with supply clipping, biasing diodes, and/or slew rate limitations. Still further sources of noise/distortion could also be possible, and to the extent that they may originate at a frequency that could be addressed by the targeted filtering, the potential for noise/distortion could be addressed before it has a chance to manifest in a frequency of interest.

Figure 4:
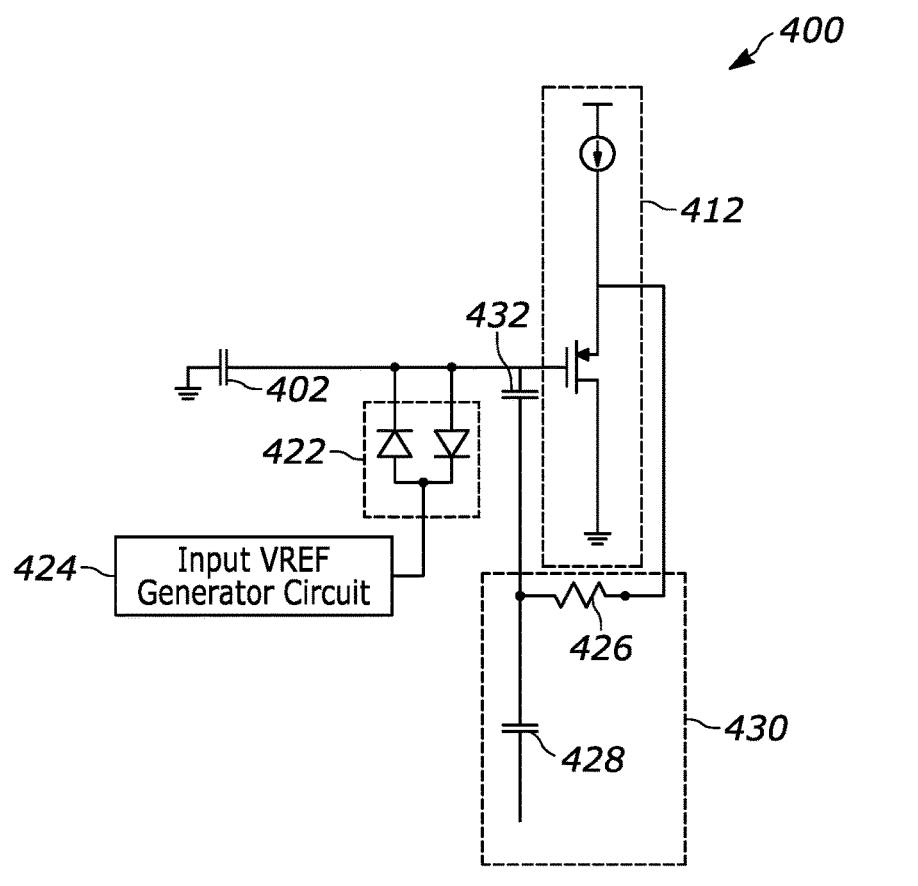
FIG. 4 is a simplified partial schematic of the MEMS sensor assembly with greater focus on frequency dependent input attenuation.

FIG. 4 illustrates a simplified partial schematic 400 of the MEMS sensor assembly with greater focus on frequency dependent input attenuation. More specifically, the simplified partial schematic 400 includes a MEMS capacitive motor illustrated as capacitor 402, where one end of the capacitor 402 is coupled to ground and the other end of the capacitor 402 is coupled to the input of a buffer circuit 412. The end of the capacitor that is coupled to the input of the buffer circuit is additionally coupled to a pair of biasing diodes 422, which couples the potential of the capacitor terminal to a predefined Vref potential, which is shown as being produced by a corresponding generator circuit 424.

The buffer circuit 412 is coupled to a resistor 426 in combination with a capacitor 428, which together form a low pass filter 430. The low pass filter 430 in combination with a feedback capacitor 432 form a frequency dependent input attenuator. By adjusting the particular values of resistor 426 and capacitor 428, the position of the corner frequency of the low pass filter can be correspondingly adjusted. By adjusting the value of the feedback capacitor, the amount of attenuation can also be adjusted.

Figures 5, 6:
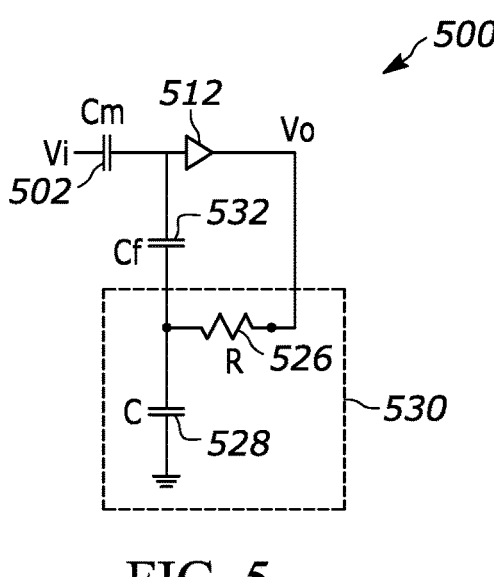
FIG. 5 is a more focused circuit schematic of an electrical equivalence of the input attenuation associated with the MEMS sensor assembly with a frequency dependent input attenuator, illustrated in FIG. 4.
FIG. 6 is a more detailed circuit schematic of an exemplary MEMS sensor assembly with a frequency dependent input attenuator including a buffer circuit having multiple amplifier stages.

FIG. 5 illustrates a more focused circuit schematic 500 of an electrical equivalence of the input attenuation associated with the MEMS sensor assembly with a frequency dependent input attenuator 400, illustrated in FIG. 4. The electrical equivalence is shown for purposes of modeling the behavior of the circuit. More specifically, the mosfet/current source combination of FIG. 4 is illustrated as a buffer 512 in FIG. 5. Capacitor (Cm) 502 corresponds to the MEMS capacitive motor. The R/C network including resistor (R) 526, and capacitor (C) 528 corresponds to the low pass filter 530, and capacitor (Cf) 532 corresponds to the feedback capacitor.

From the model, the following equations can be determined:

$$(V_i - V_o)*sCm = (V_o - V_o/1 + sRC)*sCf$$

where $(V_i - V_o)*sCm$ represents the current through Cm, and $(V_o - V_o/1 + sRC)*sCf$ represents the current through Cf, where the buffer including a mosfet at the input has a high input impedance, and where $$\frac{v_0}{1 + sRC}$$

is the voltage at the node formed by the intersection of Cf, R and C, which is the voltage divided value related to the low pass filter formed by the R/C network.

From this equation it follows:

$$V_i * sCm - V_o * sCm = V_o * sCf - V_o * \frac{sCf}{1 + sRC}$$

-continued $$V_i * sCm = V_o * \left( sCm + sCf - \frac{sCf}{1 + sRC} \right)$$

$$\frac{V_o(s)}{V_i(s)} = Cm/ \left( Cm + Cf - \frac{Cf}{(1 + sRC)} \right)$$

because s=jw, and w=2πf, as f decreases in value the term sRC goes to zero, resulting in $$\frac{V_o(s)}{V_i(s)}$$

having a gain of 1. As f increases in value the term sRC gets larger making the term $$\frac{Cf}{(1 + sRC)}$$

get smaller. In turn, as f increases, this results in $$\frac{V_o(s)}{V_i(s)}$$

approaching a gain of Cm/(Cm+Cf). Effectively, the feedback capacitor is guarded in-band of the low pass filter resulting in unity gain, and attenuates to a maximum of Cm/(Cm+Cf) for high frequencies. So, as the frequency increases, the circuit provides a degree of attenuation dependent upon the corresponding capacitive values associated with the MEMS capacitive motor and the feedback capacitor (Cf), the values of which can be managed to produce the desired degree of attenuation. In at least some embodiments, a target attenuation of approximately 4 dB in peak amplitude can be used to produce a target reduction of intermodulation distortion.

FIG. 6 illustrates a more detailed circuit schematic of an exemplary MEMS sensor assembly 600 with a frequency dependent input attenuator including a buffer circuit having multiple amplifier stages. The exemplary MEMS sensor assembly 600, similar to the sensor assembly 300 of FIG. 3 includes a capacitive MEMS motor 602, a bias voltage source 608, a buffer circuit 612, and a frequency dependent input attenuator 618. In FIG. 6, the buffer circuit shows multiple amplifier stages including at least a first amplifier stage 614 and a second amplifier stage 640. The output of the first amplifier stage 614 is coupled to the input of the second amplifier stage 640 via an interstage low pass filter 642 coupled in series with an interstage high pass filter 644. In at least some instances, each amplifier stage of the buffer circuit could be a class AB amplifier stage.

Similar to the more detailed representation in FIGS. 4 and 5, the frequency dependent input attenuator is shown as including a frequency dependent input attenuator low pass filter 630, and a feedback capacitor 632. The input of the frequency dependent input attenuator low pass filter 630 is coupled to the node between the interstage low pass filter 642 and the interstage high pass filter 644. Together, the frequency dependent input attenuator low pass filter 630 and interstage low pass filter 642 form part of potentially multiple cascaded low pass filters, which together can contribute to the frequency dependent input attenuation. In essence, by separately managing the R/C values associated with each of the cascaded low pass filters the amount of attenuation can be separately selectively introduced relative to different frequencies corresponding to the locations of the respective corner frequencies. In turn this can be used to better manage the location and the rate at which different amounts of attenuation are introduced as part of the feedback path.

Such a composite attenuator could utilize a first low pass filter to start to attenuate the signal at a frequency, which is slightly past the peak frequency of the motor, and a second cascaded low pass filter having a corner frequency positioned at a lower frequency, in order to electrically load the feedback capacitor 632 connected to the input of the buffer circuit 612. Additionally, this second cascaded low pass filter could have a lower slope than the first low pass filter. Further the relative positioning of the corner frequencies of the low pass filter could be managed to adjust the amount and the rate at which attenuation is applied so as to better manage and counter act the potential for any unwanted droop in sensitivity, such as in the frequency range between 1 kHz and 10 kHz, which is a subset of an even larger range that a capacitive MEMS motor sensor for detecting audible frequencies might be expected to have. In at least some instances, the MEMS motor sensor could be expected to have a frequency response that includes a range that is between 0.1 Hz and at least 20 kHz. Generally, a low pass filter will attenuate a signal at and above its associated corner frequency.

Figure 7:
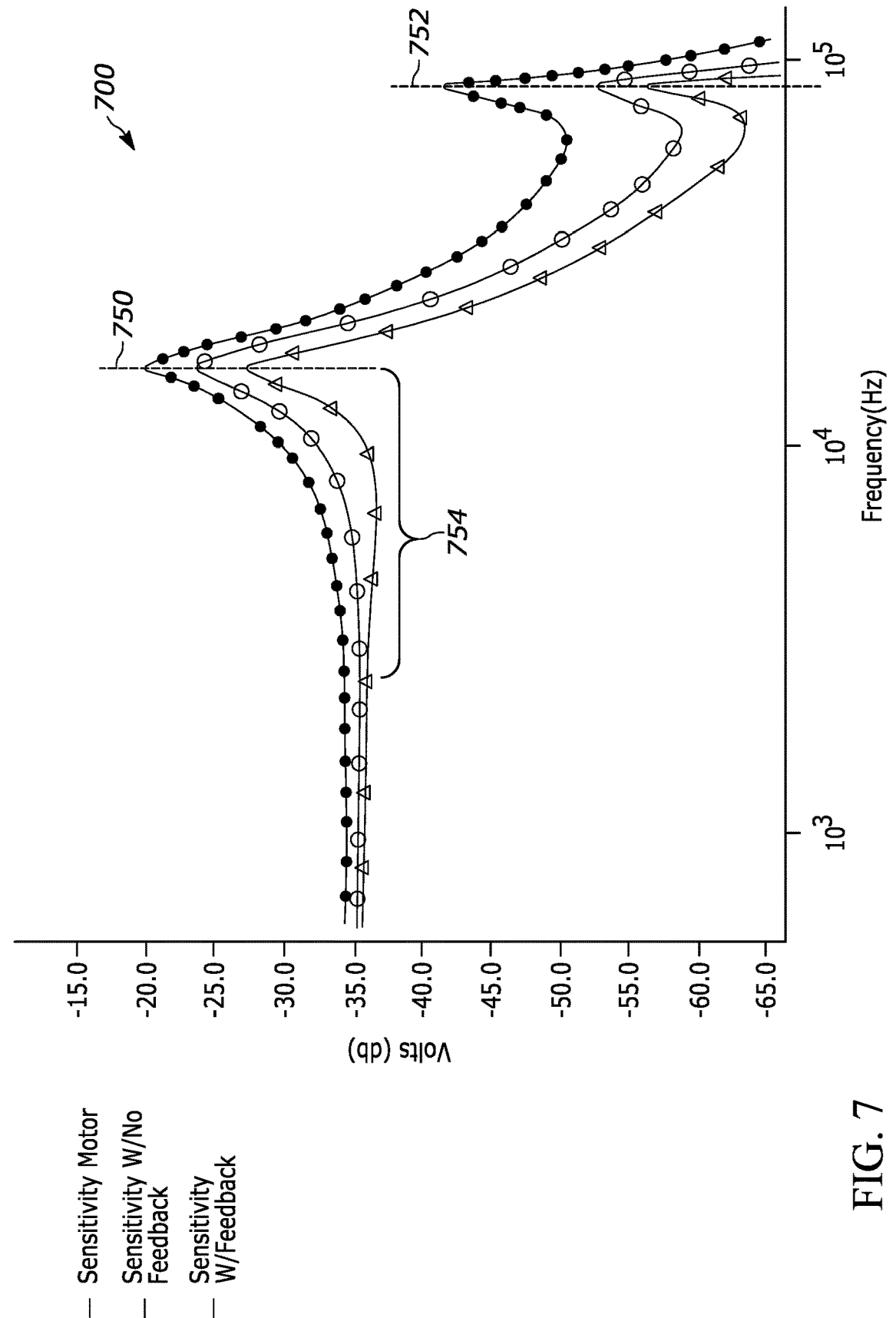
FIG. 7 is a graph illustrating a frequency response sensitivity for an exemplary MEMS sensor assembly in multiple configurations including both in and out of circuit, as well as with the selective inclusion of input attenuating feedback.

FIG. 7 is a graph 700 illustrating a frequency response sensitivity for an exemplary MEMS sensor assembly in multiple configurations including both in and out of circuit, as well as with the selective inclusion of input attenuating feedback. In the illustrated graph, the three lines represent the sensitivity of the capacitive sensor at different frequencies for three different conditions including (1) the capacitive sensor by itself, (2) the capacitive sensor in circuit without frequency dependent input attenuation, and (3) the capacitive sensor in circuit with frequency dependent input attenuation. The particular sensor has two frequencies at which the sensitively spikes relative to other nearby frequencies, which are identified at the frequencies identified at positions 750 and 752. In each case the relative sensitivity of the capacitive sensor is affected by both being included in the overall circuit, as well as the inclusion of the additional frequency dependent input attenuator. Still further an approximate frequency range 754 is identified where there can be a potential for an unwanted droop in sensitivity, dependent upon how quickly the attenuation associated with the feedback path might be introduced. By managing the amount of attenuation and the position (corner frequency) corresponding to when the attenuation is introduced, control of the amount of droop in the sensitivity, if any, can be better managed. By making use of multiple cascaded low pass filters, one can potentially have greater control over the overall amount of attenuation, and how quickly the attenuation increases relative to the frequency of the sensed signal.

For example, in at least one embodiment, the frequency dependent input attenuator low pass filter has a corner frequency, which is located above the audible frequency range but is below the acoustic peak frequency of the acoustic MEMS motor. In instances where the acoustic peak frequency is within the audible frequency range, the position of the corner frequency may need to be adjusted, and may not necessarily be above the audible frequency range. In some cases one of the cascaded low pass filters could function as a coarse adjust, and another one of the cascaded low pass filters could function as a fine adjust.

Figure 8:
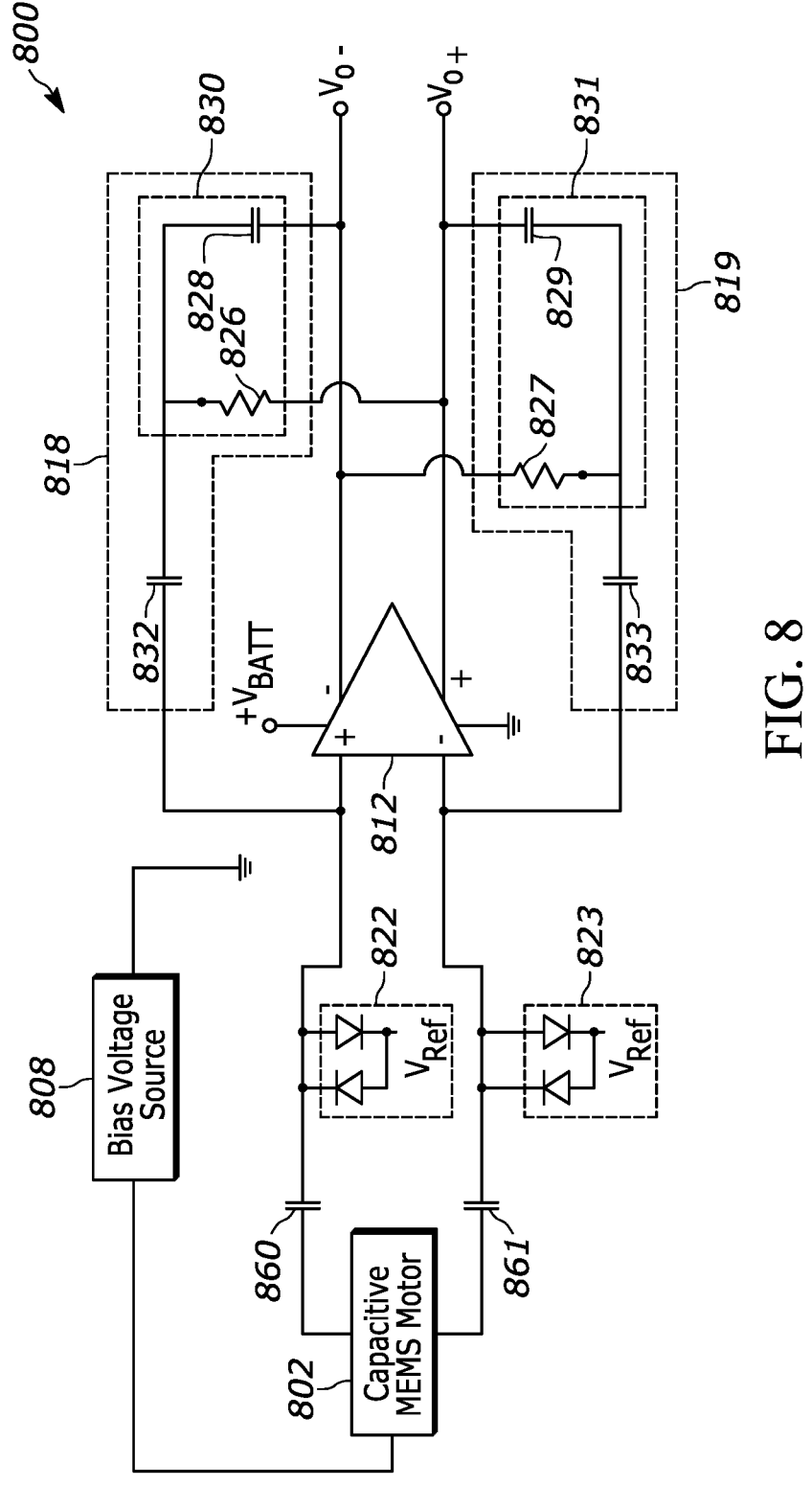
FIG. 8 is a schematic diagram of a differential MEMS sensor assembly with frequency dependent input attenuation.

FIG. 8 illustrates a schematic diagram of a differential MEMS sensor assembly 800, that could similarly incorporate frequency dependent input attenuation. The differential MEMS sensor assembly includes a capacitive MEMS motor 802, that is capable of supporting the generation of a differential signal, which in turn is supplied to the differential input of a buffer circuit 812. The differential capacitive MEMS motor is also coupled to a bias voltage source 808, that is capable of producing one or more bias voltages. Each portion of the differential signal is alternatively referenced as positive and negative.

The positive branch of the differential signal, which is produced by the differential capacitive MEMS motor 802 is coupled to the positive input terminal of the buffer circuit 812 via a corresponding DC blocking capacitor 860, and includes a corresponding pair of biasing diodes 822, which couple the path to a predefined reference voltage Vref, after the DC blocking capacitor 860.

The negative branch of the differential signal, which is produced by the differential capacitive MEMS motor 802 is respectively coupled to the negative input terminal of the buffer circuit 812 via a corresponding DC blocking capacitor 861, and includes a corresponding pair of biasing diodes 823, which couple the path to a predefined reference voltage Vref, after the DC blocking capacitor 861.

In the illustrated embodiment, the buffer circuit 812 produces a differential output including both a positive side and a negative side, where each side includes a respective frequency dependent input attenuator 818, 819, each of which includes a corresponding low pass filter 830, 831, and feedback capacitor 832, 833.

More specifically, the low pass filter 830 of the positive side includes a resistor 826, which couples the feedback capacitor 832 to the positive output of the buffer circuit 812, and a capacitor 828 that couples the feedback capacitor 832 to the negative output of the buffer circuit 812. The feedback capacitor 832 is further coupled to the positive input of the buffer circuit 812. Alternatively, the low pass filter 831 of the negative side includes a resistor 827 that couples the feedback capacitor 833 to the negative output of the buffer circuit 812, and a capacitor 829 that couples the feedback capacitor 833 to the positive output of the buffer circuit 812. The feedback capacitor 833 is further coupled to the negative input of the buffer circuit 812. In this way frequency dependent input attenuation could also be used in support of a differential capacitive MEMS motor for producing a differential output signal.

FIG. 9 illustrates a flow diagram 900 of an exemplary method of operating a sensor assembly with a frequency dependent input attenuator. The method includes producing 902 a DC bias voltage and supplying the produced DC bias voltage to a MEMS motor. A stimulus is detected 904 by the MEMS motor, and a signal having a voltage is produced. The signal is applied 906 to a sensing circuit by applying the signal to an input of an amplifier input stage. A peak resonance signal of the MEMS sensor is attenuated 908, by electrically loading a feedback capacitor coupled between the output of the amplifier input stage and the input of the amplifier input stage by an input attenuator low pass filter with a signal that has been attenuated at the higher frequencies above the corner frequency of the input attenuator low pass filter.

In some instances, the input attenuator low pass filter can have a corner frequency, which is located above the audible frequency range. In some of these instances, the corner frequency of the input attenuator low pass filter can be located below an acoustic peak frequency of the acoustic MEMS motor.

It should be understood that, notwithstanding the particular steps as shown in the figures, a variety of additional or different steps can be performed depending upon the embodiment, and one or more of the particular steps can be rearranged, repeated or eliminated entirely depending upon the embodiment. Also, some of the steps performed can be repeated on an ongoing or continuous basis simultaneously while other steps are performed. Furthermore, all or portions of different steps can be performed by different elements or by a single element of the disclosed embodiments.

For at least some embodiments, at least some methods or portions thereof in this disclosure can be implemented on or under the control of a programmed processor or controller. However, the controllers, flowcharts, and modules may also be implemented on or under the control of a general purpose or special purpose computer, a programmed microprocessor or microcontroller and peripheral integrated circuit elements, an integrated circuit, a hardware electronic or logic circuit such as a discrete element circuit, a programmable logic device, or the like.

At least some embodiments can improve operation of the disclosed devices. Also, while this disclosure has been described with specific embodiments thereof, it will be evident that many alternatives, modifications, and variations will be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the disclosure by simply employing the elements of the independent claims. Accordingly, embodiments of the disclosure as set forth herein are intended to be illustrative, not limiting. Various changes may be made without departing from the spirit and scope of the disclosure.

In this document, relational terms such as "first," "second," and the like may be used solely to distinguish one entity or action from another entity or action without necessarily requiring or implying any actual such relationship or order between such entities or actions. The phrase "at least one of," "at least one selected from the group of," or "at least one selected from" followed by a list is defined to mean one, some, or all, but not necessarily all of, the elements in the list. The terms "comprises," "comprising," "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a," "an," or the like does not, without more constraints, preclude the existence of additional identical elements in the process, method, article, or apparatus that comprises the element. Also, the term "another" is defined as at least a second or more. The terms "including," "having," and the like, as used herein, are defined as "comprising." Furthermore, the background section is written as the inventor's own understanding of the context of some embodiments at the time of filing and includes the inventor's own recognition of any problems with existing technologies and/or problems experienced in the inventor's own work.

What is claimed is:

1. A microelectromechanical systems (MEMS) sensor comprising:
   a housing comprising electrical contacts disposed on an exterior of the housing;
   a capacitive MEMS motor disposed in the housing; and
   an electrical circuit disposed in the housing and electrically coupled to the electrical contacts, the electrical circuit comprising:
      a bias voltage source having an output coupled to an input of the capacitive MEMS motor;
      a buffer circuit including an amplifier input stage having an input coupled to an output of the capacitive MEMS motor; and
      a frequency dependent input attenuator including a feedback capacitor and an input attenuator low pass filter, the input attenuator low pass filter having an input coupled to an output of the amplifier input stage and an output coupled to a first terminal of the feedback capacitor, where a second terminal of the feedback capacitor is coupled to the input of the amplifier input stage.

2. The MEMS sensor of claim 1 is a microphone having a frequency response between 0.1 Hz and at least 20 KHz.

3. The MEMS sensor of claim 1, wherein the corner frequency of the input attenuator low pass filter is located below an acoustic peak frequency of the capacitive MEMS motor.

4. A capacitive microelectromechanical systems (MEMS) motor sensing circuit comprising:
   a buffer circuit including an amplifier input stage having an input connectable to an output of a capacitive MEMS motor; and
   a frequency dependent input attenuator including a feedback capacitor and an input attenuator low pass filter, the input attenuator low pass filter having an input coupled to an output of the amplifier input stage and an output coupled to a first terminal of the feedback capacitor, where a second terminal of the feedback capacitor is coupled to the input of the amplifier input stage.

5. The capacitive MEMS motor sensing circuit of claim 4, wherein the corner frequency of the input attenuator low pass filter is located below an acoustic peak frequency of the capacitive MEMS motor.

6. The capacitive MEMS motor sensing circuit of claim 4, wherein the amplifier input stage is a class AB amplifier.

7. The capacitive MEMS motor sensing circuit of claim 4, wherein the buffer circuit additionally includes an amplifier output stage, where the output of the amplifier input stage is coupled to the input of the amplifier output stage.

8. The capacitive MEMS motor sensing circuit of claim 7, wherein each of the amplifier input stage and the amplifier output stage of the buffer circuit are a class AB amplifier.

9. The capacitive MEMS motor sensing circuit of claim 7, wherein the amplifier output stage is coupled to the amplifier input stage via an interstage low pass filter coupled in series with an interstage high pass filter, where an output of the interstage low pass filter is coupled to an input of the interstage high pass filter.

10. The capacitive MEMS motor sensing circuit of claim 9, wherein the input of the input attenuator low pass filter is coupled to the output of the amplifier input stage via the interstage low pass filter, where the input of the input attenuator low pass filter is coupled to the output of the interstage low pass filter.

11. The capacitive MEMS motor sensing circuit of claim 10, wherein the corner frequency of the interstage low pass filter is at or slightly above the acoustic peak frequency of the capacitive MEMS motor.

12. The capacitive MEMS motor sensing circuit of claim 10, wherein the corner frequency of the interstage low pass filter is above the corner frequency of the input attenuator low pass filter.

13. The capacitive MEMS motor sensing circuit of claim 4, wherein the buffer circuit further includes a further amplifier input stage having an input connectable to a further output of the capacitive MEMS motor; and
   wherein the frequency dependent input attenuator further includes a further feedback capacitor and a further input attenuator low pass filter, coupled in series between an output of the further amplifier input stage and the input of the further amplifier input stage, the further input attenuator low pass filter having an input coupled to the output of the further amplifier input stage and an output coupled to a first terminal of the further feedback capacitor, where a second terminal of the further feedback capacitor is coupled to the input of the further amplifier input stage.

14. The capacitive MEMS motor sensing circuit of claim 13, wherein the output of the capacitive MEMS motor and the further output of the capacitive MEMS motor together, form a differential output of the capacitive MEMS motor.

15. A method implemented in a capacitive microelectromechanical systems (MEMS) sensor, the method comprising:
   producing a DC bias voltage and supplying the produced DC bias voltage to a MEMS motor;
   detecting, by the MEMS motor, a stimulus, and producing a signal having a voltage;
   applying the signal to a sensing circuit by applying the signal to an input of an amplifier input stage; and
   attenuating a peak resonance signal of the MEMS sensor by electrically loading a feedback capacitor coupled between an output of the amplifier input stage and the input of the amplifier input stage by an input attenuator low pass filter with a signal that has been attenuated at the higher frequencies above the corner frequency of the input attenuator low pass filter.

16. The method in accordance with claim 15, wherein the corner frequency of the input attenuator low pass filter is located below an acoustic peak frequency of the MEMS motor.

* * * * *